(12) United States Patent
Choi

(10) Patent No.: US 7,696,727 B2
(45) Date of Patent: Apr. 13, 2010

(54) APPARATUS AND METHOD FOR MEASURING THE AMOUNT OF THE CURRENT IN BATTERY CELLS USING A PLURALITY OF SENSING RESISTORS

(75) Inventor: Jin Ho Choi, Siheung-si (KR)

(73) Assignee: LG Chem, Ltd. (KR)

( * ) Notice: Subject to any disclaimer, the term of this patent is extended or adjusted under 35 U.S.C. 154(b) by 533 days.

(21) Appl. No.: 11/394,907

(22) Filed: Mar. 31, 2006

(65) Prior Publication Data

US 2006/0267592 A1  Nov. 30, 2006

(30) Foreign Application Priority Data

Mar. 31, 2005  (KR) ...................... 10-2005-0027038

(51) Int. Cl.
*H02J 7/16* (2006.01)
*H02J 7/00* (2006.01)
(52) U.S. Cl. ........................... 320/149; 320/128
(58) Field of Classification Search ........... 320/127, 320/132, 134, 136, 149; 324/425–427, 434
See application file for complete search history.

(56) References Cited

U.S. PATENT DOCUMENTS 4,707,795 A * 11/1987 Alber et al. ................. 702/63
5,479,085 A * 12/1995 Honda et al. ............... 320/134
6,014,030 A    1/2000 Smith et al.
6,445,162 B1 * 9/2002 Mukainakano ............. 320/132
6,495,989 B1 * 12/2002 Eguchi ....................... 320/132
7,262,605 B2 * 8/2007 Seo et al. ................... 324/522

FOREIGN PATENT DOCUMENTS

WO   WO99/27628 A1   6/1999

OTHER PUBLICATIONS

European Office Action for Application No. 06732760.1 dated Dec. 18, 2008.

* cited by examiner

*Primary Examiner*—Edward Tso
*Assistant Examiner*—Ahmed Omar
(74) *Attorney, Agent, or Firm*—Cantor Colburn, LLP

(57) ABSTRACT

Disclosed is an apparatus for measuring an amount of current in battery cells. The apparatus includes: a plurality of resistors (R1, R2, and R3) connected in parallel; a main chip connected to both ends of one (R1) of the plurality of resistors, detecting voltage across the connected resistor, and adding up the amount of current on the basis of the detected voltage; a multiplexer selecting one of the other resistors (R2 and R3) when the amount of current added up at the main chip exceeds a predetermined threshold value; and a plurality of switches connected to the plurality of resistors respectively, and switched on/off by an output signal of the multiplexer. Thereby, it is possible to prevent damage to the surrounding components caused by the generation of heat from the single detection resistor, and detect a more precise amount of current in the battery cells.

7 Claims, 3 Drawing Sheets

APPARATUS AND METHOD FOR MEASURING THE AMOUNT OF THE CURRENT IN BATTERY CELLS USING A PLURALITY OF SENSING RESISTORS

This application claims the benefit of the filing date of Korean Patent Application No. 2005-27038, filed on Mar. 31, 2005, in the Korean Intellectual Property Office, the disclosure of which is incorporated herein in its entirety by reference.

TECHNICAL FIELD

The present invention relates to an apparatus for measuring an amount of current in battery cells, and more particularly to an apparatus and method for measuring an amount of current in battery cells using multiple detection resistors connecting in parallel a plurality of resistors having a different value of resistance.

BACKGROUND ART

A conventional method of calculating an amount of current in battery cells has employed a method of detecting and integrating the current in each component using a single fixed detection resistor. This method generates heat due to the use of the single detection resistor, and specifically due to the current in the detection resistor when a long time has lapsed, so that the measurement of the current amount in the battery cells is lowered in precision.

A battery pack fuel gauging system using such a single detection resistor will be described with reference to FIG. 1.

Referring to FIG. 1, the existing battery pack fuel gauging system 100 comprises battery cells, a resistor 101 for detecting the current from the battery cells, and a main chip 102 detecting and integrating an amount of the detected current.

This battery pack fuel gauging system employs a method of detecting the current in the detection resistor 101 at the main chip 102 at constant time intervals, and continuously adding up the current.

However, in the method used in the conventional system, increase of the current in the detection resistor 101 during charging or discharging causes an increase in temperature, so that the measurement of the amount of current added up at the main chip 102 is lowered in precision, which has a bad influence on the surrounding components.

Thus, there is formed the necessity of preventing damage to the surrounding components caused by the generation of heat of the detection resistor 101 during charging or discharging, and detecting a more precise amount of battery current.

DISCLOSURE OF THE INVENTION

Therefore, the present invention has been made in view of the above-mentioned problems, and it is an object of the present invention to provide an apparatus and method for measuring an amount of current in battery cells, in which a plurality of resistors having a different value of resistance are connected in parallel, the voltage across each resistor is detected, and the amount of current is calculated on the basis of the detected voltage, thereby preventing damage to the surrounding components caused by the generation of heat from the resistor, and detecting a more precise amount of battery current.

According to an aspect of the present invention, there is provided an apparatus for measuring an amount of current in battery cells. The apparatus comprises: a plurality of resistors (R1, R2, and R3) connected in parallel; a main chip connected to both ends of one (R1) of the plurality of resistors, detecting voltage across the connected resistor, and adding up the amount of current on the basis of the detected voltage; a multiplexer selecting one of the other resistors (R2 and R3) when the amount of current added up at the main chip exceeds a predetermined threshold value; and a plurality of switches connected to the plurality of resistors respectively, and switched on/off by an output signal of the multiplexer.

Here, the plurality of resistors may each have a different value of resistance.

Further, the switches may each include Field Effect Transistor (FET) or Bipolar Junction Transistor (BJT).

In addition, the multiplexer may include a selection circuit.

According to an aspect of the present invention, there is provided a method for measuring an amount of current in battery cells. The method comprises the steps of: detecting voltage across one of a plurality of resistors; adding up the amount of current in the battery cells on the basis of the detected voltage; determining whether or not the added-up amount of current in the battery cells exceeds a predetermined threshold value; when the added-up amount of current in the battery cells exceeds the predetermined threshold value, outputting a control signal to a multiplexer; and switching on, by the multiplexer, a switch connected to one of the resistors other than the detected resistor on the basis of the control signal.

MODE FOR CARRYING OUT THE INVENTION

Reference will now be made in detail to the preferred embodiments of the present invention.

Figure 1:
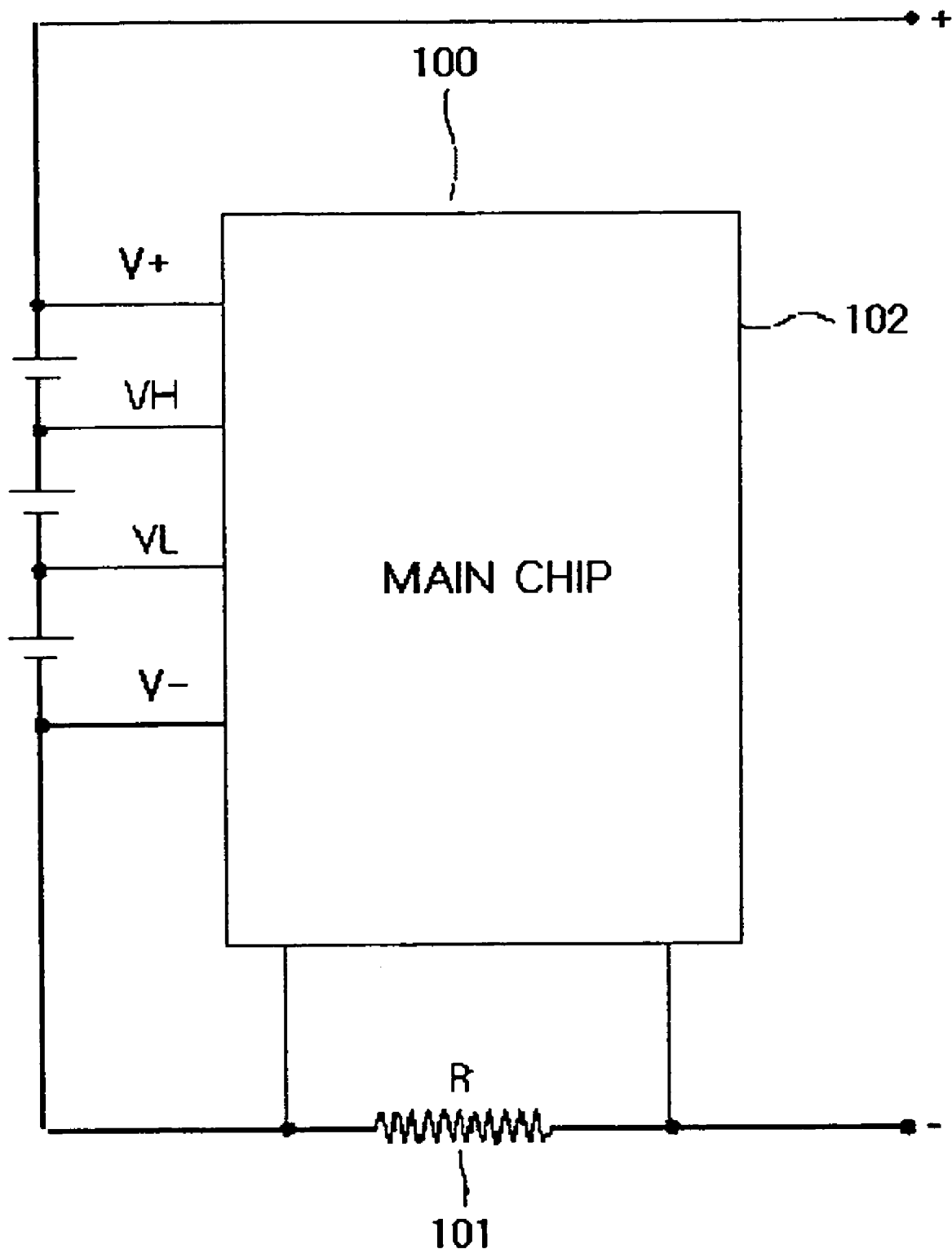
FIG. 1 schematically illustrates a conventional apparatus for measuring an amount of current in battery cells using a detection resistor.
Figure 2:
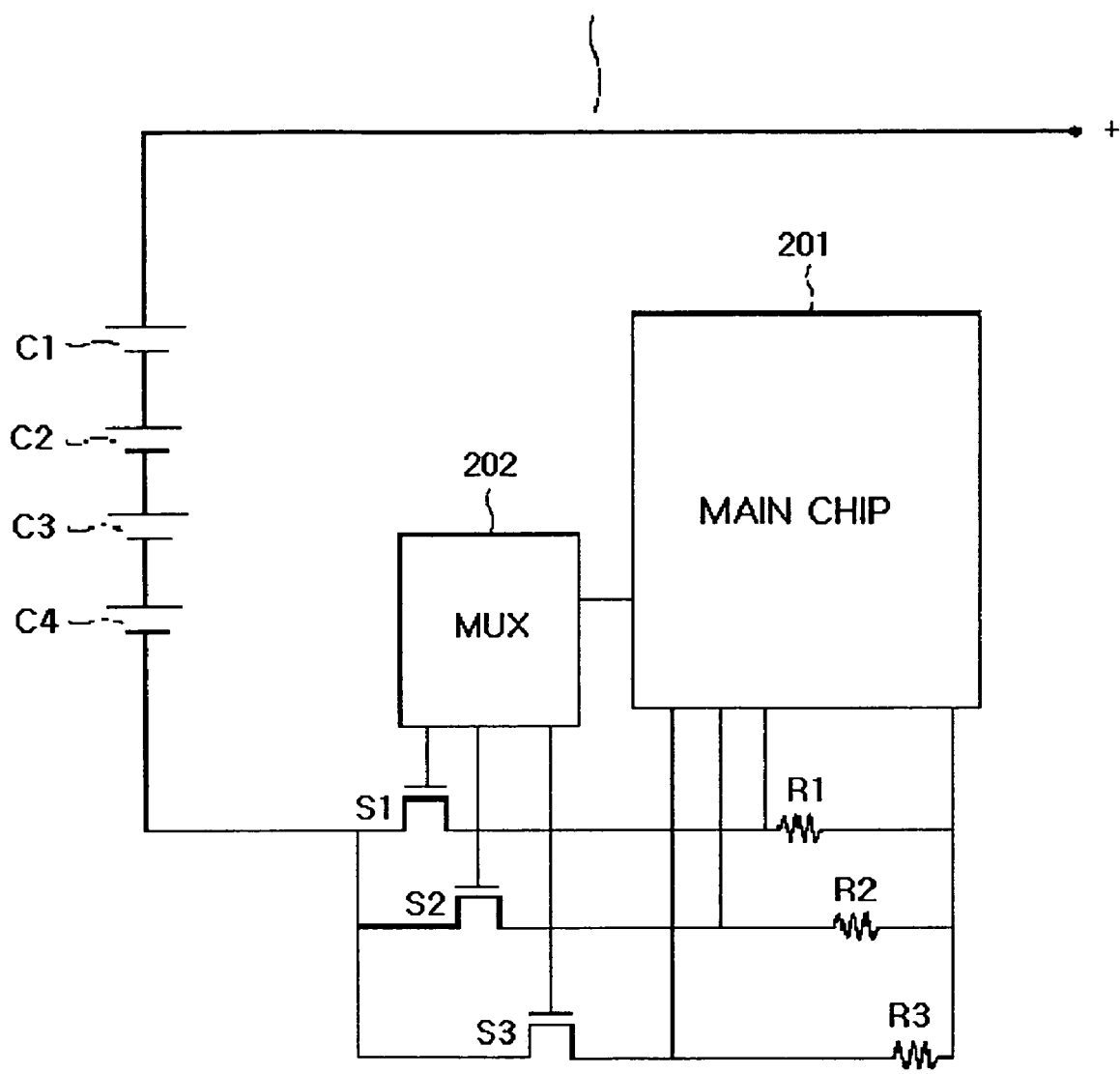
FIG. 2 illustrates an apparatus for measuring an amount of current in battery cells using a plurality of detection resistors in accordance with an embodiment of the present invention.

FIG. 2 illustrates an apparatus 200 for measuring an amount of current in battery cells using a plurality of detection resistors in accordance with an embodiment of the present invention.

Referring to FIG. 2, the apparatus 200 for measuring an amount of current in battery cells in accordance with an embodiment of the present invention comprises a plurality of resistors R1, R2, and R3 for detecting the current from the battery cells, a main chip 201 adding up the detected amount of current, a plurality of switches S1, S2, and S3 connected to the plurality of resistors respectively, and a multiplexer (MUX) 202 switching on/off the switches based on a control signal of the main chip 201.

In the apparatus 200 for measuring an amount of current in battery cells in accordance with the present invention, the current flows from battery cells C1, C2, C3, and C4 to the plurality of resistors R1, R2, and R3. The battery cells C1, C2, C3, and C4 are connected in parallel with the plurality of resistors R1, R2, and R3. In this manner, because the battery cells are connected in parallel with the plurality of resistors, the current from the battery cells can be distributed to each resistor. Each of the resistors has a different value of resistance.

First, the current from the battery cells C1, C2, C3, and C4 flows through one R1 of the plurality of resistors. The main chip 201 detects the voltage across the resistor R1, and adds up it as an amount of current. The amount of current added up reaches a predetermined threshold value with the lapse of time.

When the amount of current detected at the resistor R1 reaches the predetermined threshold value, the main chip 201 instructs the MUX 202 to switch on the switch S2 of the resistor R2. On the basis of the instruction of the main chip 201, the MUX 202 switches on the switch S2, which is connected to the resistor R2. Further, MUX 202 can be constructed as a selection circuit.

Accordingly, the current from the battery cells C1, C2, C3, and C4 is distributed and flows through the resistors R1 and R2. The main chip 201 detects the voltage across each of the resistors R1 and R2, and adds up each amount of current. Likewise, the amount of current added up reaches a predetermined threshold value with the lapse of time.

When the amount of current detected at the resistors R1 and R2 reaches the predetermined threshold value, the main chip 201 instructs the MUX 202 to switch on the switch of the resistor R3. On the basis of the instruction of the main chip 201, the MUX 202 switches on the switch S3, which is connected to the resistor R3. The switches S1, S2, and S3 can be formed from Field Effect Transistor (FET) and Bipolar Junction Transistor (BJT).

In this manner, the existing problems on the generation of heat when the amount of current of the battery cells is measured using a single detection resistor can be solved by distributing the current from the battery cells using the plurality of detection resistors.

Therefore, the apparatus for measuring the amount of current in the battery cells in accordance with the present invention can not only prevent damage to the surrounding components caused by the generation of heat from the single detection resistor, but also detect a more precise amount of current in the battery cells.

On the basis of this construction, a method for measuring the amount of current in the battery cells will be described with reference to FIG. 3.

Figure 3:
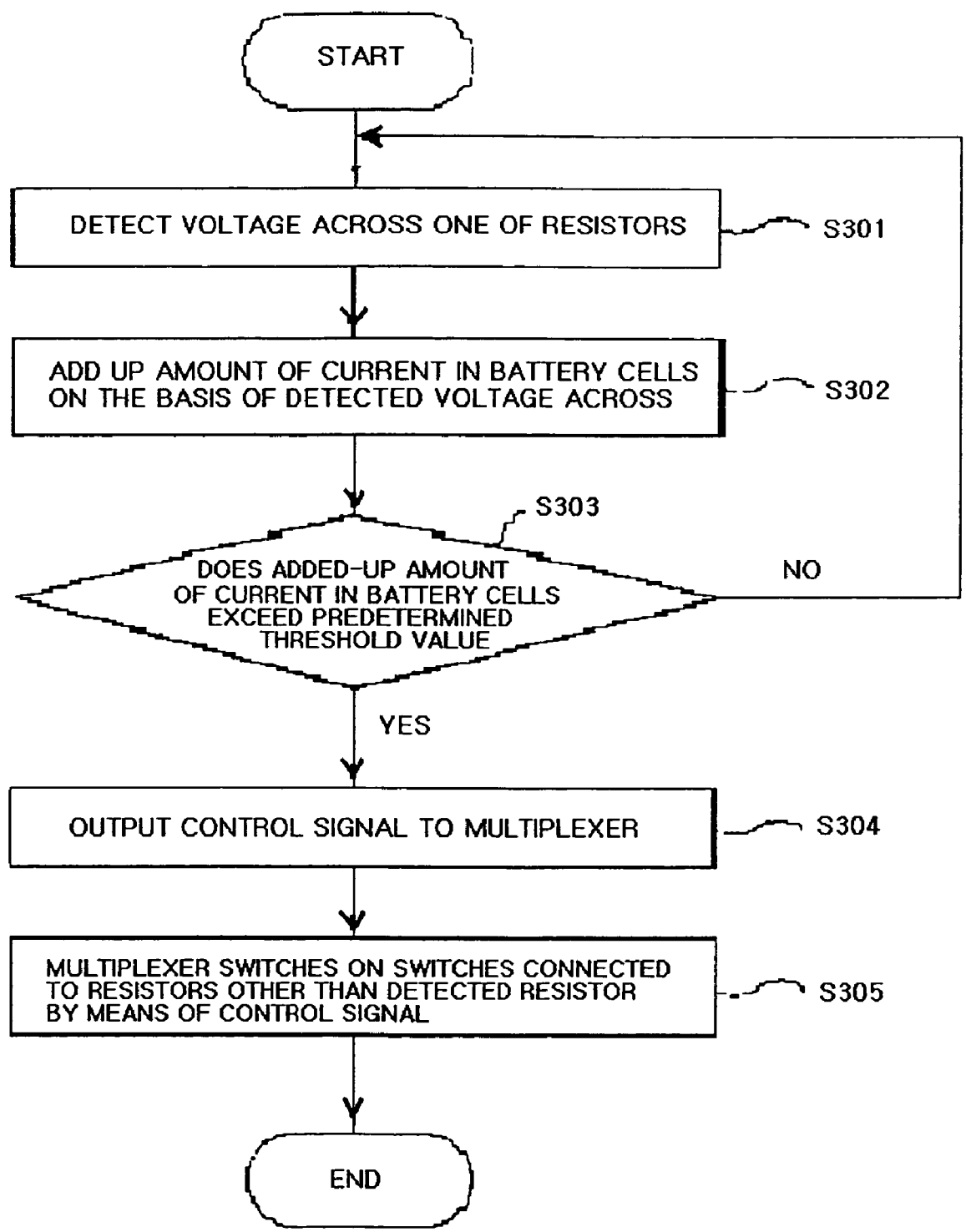
FIG. 3 illustrates a method for measuring an amount of current in battery cells using a plurality of detection resistors in accordance with an embodiment of the present invention.

Referring to FIG. 3, in step S301, the voltage across one of the resistors from the battery cells is detected at the main chip 201.

In step S302, on the basis of the detected voltage across the resistor, an amount of battery current is added up at the main chip 201.

In step S303, it is continuously determined whether or not the amount of current added up at the main chip 201 exceeds a predetermined threshold value.

In step S304, if the amount of current added up at the main chip 201 exceeds the predetermined threshold value, a control signal is output to the MUX 202. In contrast, if the amount of current added up at the main chip 201 does not exceed the predetermined threshold value, the process returns to step S301.

In step S305, on the basis of the control signal of the main chip 201, the MUX 202 switches on the switches connected to resistors other than the detected resistor, and then the process is ended.

INDUSTRIAL APPLICABILITY

With the configuration of the apparatus and method for measuring the amount of current in the battery cells, the plurality of resistors having different values of resistance are connected in parallel, and the current in the resistors is distributed. Thereby, it is possible to not only prevent damage to the surrounding components caused by the generation of heat from the resistor, but also detect a more precise amount of battery current.

While this invention has been described in connection with what is presently considered to be the most practical and preferred embodiment, it is to be understood that the invention is not limited to the disclosed embodiment and the drawings, but, on the contrary, it is intended to cover various modifications and variations within the spirit and scope of the appended claims.

The invention claimed is:

1. An apparatus for measuring an amount of current in battery cells, the apparatus comprising:
   a plurality of resistors connected in parallel and installed on a current flow line connected to the battery cells;
   a plurality of switches connected to the plurality of resistors respectively, and switching on/off the current from the battery cells to each of the plurality of switches;
   a multiplexer outputting a switching signal to each of the plurality of switches;
   a main chip controlling the operation of the multiplexer, the main chip being connected to both ends of each resistor of the plurality of resistors, and integrating current flowing in switched-on resistor (s) over time and calculating a total current from the integrated current and increasing a number of resistors of the plurality of resistors having current flowing therethrough by controlling the multiplexer according to a level increase of the current.

2. The apparatus according to claim 1, wherein the plurality of resistors each have a different value of resistance.

3. The apparatus according to claim 1, wherein the switches each include Field Effect Transistor (FET) or Bipolar Junction Transistor (BJT).

4. The apparatus according to claim 1, wherein the multiplexer includes a selection circuit.

5. A method for measuring an amount of current in battery cells, the method comprising the steps of:
   detecting a current flowing in one or more switched-on resistors among a plurality of resistors connected in parallel and installed on a current flow line connected to the battery cells;
   integrating the detected current in switched-on resistor(s) over time and calculating a total current from the integrated current; and
   increasing a number of the switched on resistors by switching on additional resistors of the plurality of resistors according to a level increase of the total current.

6. The method according to claim 5, wherein the increasing step includes returning to the detecting step when the added-up amount of current in the battery cells does not exceed a predetermined threshold value.

7. An apparatus for measuring an amount of current in battery cells, comprising:
   first, second, and third resistors connected in parallel to one another and electrically coupled to a current flow line connected to the battery cells;
   first, second, and third switches connected in series to the first, second, and third resistors, respectively, the first switch having a closed operational position to allow current from the battery cells to flow through the first resistor in response to a first switching signal, the second switch having a closed operational position to allow current from the battery cells to flow through the second resistor in response to a second switching signal, the third switch having a closed operational position to allow current from the battery cells to flow through the third resistor in response to a third switching signal;

a multiplexer electrically coupled to the first, second, and third switches, respectively;

a main chip operably coupled to the multiplexer, the main chip being further connected to both ends of the first, second, and third resistors;

the main chip configured to induce the multiplexer to output the first switching signal to induce the first switch to have the closed operational position;

the main chip further configured to integrate a first current flowing through the first resistor over time and calculate a first total current from the integrated first current;

the main chip further configured to induce the multiplexer to output the second switching signal to induce the second switch to have the closed operational position when the first total current exceeds a predetermined threshold value;

the main chip further configured to maintain integration of the first current flowing through the first resistor over time and staff to integrate a current flowing through the second resistor over time and calculate a second total current from the integrated first and second current; and the main chip further configured to induce the multiplexer to output the third switching signal to induce the third switch to have the closed operational position when the second total current exceeds the predetermined threshold value.

* * * * *